United States Patent
Gwinn et al.

(10) Patent No.: US 10,861,674 B2
(45) Date of Patent: Dec. 8, 2020

(54) COMPENSATED LOCATION SPECIFIC PROCESSING APPARATUS AND METHOD

(71) Applicant: TEL Epion Inc., Billerica, MA (US)

(72) Inventors: Matthew C. Gwinn, Winchendon, MA (US); Martin D. Tabat, Nashua, NH (US); Kenneth Regan, Beverly, MA (US); Allen J. Leith, Brookline, NH (US); Michael Graf, Belmont, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 16/665,357

(22) Filed: Oct. 28, 2019

(65) Prior Publication Data

US 2020/0066485 A1 Feb. 27, 2020

Related U.S. Application Data

(63) Continuation of application No. 15/863,732, filed on Jan. 5, 2018, now Pat. No. 10,497,540.

(Continued)

(51) Int. Cl.
*H01J 37/304* (2006.01)
*H01J 37/20* (2006.01)
(Continued)

(52) U.S. Cl.
CPC ............ *H01J 37/304* (2013.01); *H01J 37/08* (2013.01); *H01J 37/147* (2013.01); *H01J 37/20* (2013.01);
(Continued)

(58) Field of Classification Search
CPC .... H01J 37/30; H01J 37/3002; H01J 37/3007; H01J 37/302; H01J 37/3023;
(Continued)

(56) References Cited

U.S. PATENT DOCUMENTS 6,521,895 B1 2/2003 Walther et al.
2002/0175297 A1 11/2002 Scheuer et al.
(Continued)

FOREIGN PATENT DOCUMENTS

JP 2013-093567 5/2013

OTHER PUBLICATIONS

Korean Patent Office; Search Report and Written Opinion in related International Patent Application No. PCT/US2018/012666 dated Apr. 27, 2018; 10 pages.

*Primary Examiner* — Jason L McCormack
(74) *Attorney, Agent, or Firm* — Wood Herron & Evans LLP (57) ABSTRACT

An apparatus and method for processing a workpiece with a beam is described. The apparatus includes a vacuum chamber having a beam-line for forming a particle beam and treating a workpiece with the particle beam, and a scanner for translating the workpiece through the particle beam. The apparatus further includes a scanner control circuit coupled to the scanner, and configured to control a scan property of the scanner, and a beam control circuit coupled to at least one beam-line component, and configured to control the beam flux of the particle beam according to a duty cycle for switching between at least two different states during processing.

19 Claims, 5 Drawing Sheets

Related U.S. Application Data (60) Provisional application No. 62/444,188, filed on Jan. 9, 2017.

(51) Int. Cl.
*H01J 37/08* (2006.01)
*H01J 37/147* (2006.01)

(52) U.S. Cl.
CPC .............. *H01J 2237/0473* (2013.01); *H01J 2237/0812* (2013.01); *H01J 2237/202* (2013.01); *H01J 2237/20228* (2013.01); *H01J 2237/30472* (2013.01)

(58) Field of Classification Search
CPC .. H01J 37/3026; H01J 37/304; H01J 37/3045; H01J 37/317; H01J 37/3171; H01J 37/3172
USPC ..... 250/491.1, 492.1, 492.2, 492.21, 492.23, 250/492.3
See application file for complete search history.

(56) References Cited

U.S. PATENT DOCUMENTS

| | | | |
|---|---|---|---|
| 2004/0238753 A1* | 12/2004 | Mikolas | H01J 37/317 250/396 R |
| 2014/0042334 A1 | 2/2014 | Wieland | |
| 2014/0065730 A1* | 3/2014 | Reece | C23C 14/48 438/5 |
| 2015/0200073 A1* | 7/2015 | Jen | H01J 37/302 250/282 |
| 2015/0325410 A1 | 11/2015 | Godet et al. | |
| 2015/0332924 A1 | 11/2015 | Regan et al. | |
| 2015/0340202 A1* | 11/2015 | Matsushita | H01J 37/3171 250/492.21 |
| 2016/0111245 A1* | 4/2016 | Saadatmand | H05H 7/12 250/424 |
| 2016/0111254 A1 | 4/2016 | Evans et al. | |

* cited by examiner

COMPENSATED LOCATION SPECIFIC PROCESSING APPARATUS AND METHOD

CROSS-REFERENCE TO RELATED APPLICATIONS

This application is a continuation of U.S. patent application Ser. No. 15/863,732 filed Jan. 5, 2018 (pending) which is a claims priority to U.S. Provisional Patent Application Ser. No. 62/444,188 filed on Jan. 9, 2017, the entire contents of which are herein incorporated by reference.

BACKGROUND OF THE INVENTION

Field of Invention

The field of invention relates generally to the fields of material processing and electronic device manufacturing and, more specifically but not exclusively, relates to the spatial processing of various workpiece attributes.

Description of Related Art

In the manufacturing of electronic devices, including surface wave acoustic (SAW) devices for radio frequency (RF) filter applications, the need for advanced precision control of feature attributes across device workpieces is rapidly escalating to meet productivity and yield requirements. Current methodologies, including beam processing systems as well as non-beam processing systems, such as spatially controlled plasma and non-plasma processing systems, are contemplated for advanced corrective processing schemes.

As an example, location specific processing by particle beam processing, including charged particle beams, is a highly precise method for correcting across-workpiece non-uniformity of feature attributes. Provided spatially resolved feature attribute data, such as feature height or thickness measured at multiple sites on a workpiece, a location specific processing scheme can be applied to correct variations in the feature attribute data to within tolerable or acceptable limits.

SUMMARY OF THE INVENTION

Embodiments of the invention relate generally to the fields of material processing and electronic device manufacturing and, more specifically but not exclusively, relates to the spatial processing of various workpiece attributes. In particular, an apparatus and method employing compensated location specific processing are described. Herein, scan speed and beam duty-cycle, among other things, are adjusted to perform location specific processing of a workpiece.

According to one embodiment, an apparatus and method for processing a workpiece with a beam is described. The apparatus includes a vacuum chamber having a beam-line for forming a particle beam and treating a workpiece with the particle beam, and a scanner for translating the workpiece through the particle beam. The apparatus further includes a scanner control circuit coupled to the scanner, and configured to control a scan property of the scanner, and a beam control circuit coupled to at least one beam-line component, and configured to control the beam flux of the particle beam according to a duty cycle for switching between at least two different states during processing.

According to another embodiment, a method for processing a workpiece with a particle beam is described. The method includes: mounting a workpiece on a scanner in a vacuum chamber for forming a particle beam and treating the workpiece with the particle beam; generating a particle beam in the vacuum chamber; scanning the workpiece through the particle beam; controllably adjusting at least one scan property of the scanner in response to a correction map for treating the workpiece; and when pre-specified scan property limits are achieved, controllably adjusting a duty cycle for toggling the beam flux of the particle beam between at least two different states.

DETAILED DESCRIPTION OF SEVERAL EMBODIMENTS

Methods and systems for performing corrective processing of a workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Workpiece" as used herein generically refers to the object being processed in accordance with the invention. The workpiece may include any material portion or structure of a device, particularly a semiconductor or other electronics device, and may, for example, be a base workpiece structure, such as a semiconductor wafer or a layer on or overlying a base workpiece structure such as a thin film. Thus, workpiece is not intended to be limited to any particular base structure, underlying layer or overlying layer, patterned or un-patterned, but rather, is contemplated to include any such layer or base structure, and any combination of layers and/or base structures. The description below may reference particular types of workpieces, but this is for illustrative purposes only and not limitation.

To improve corrective capability, methods and systems for performing location specific processing of a workpiece with enhanced dynamic range and corrective capability are described according to various embodiments. The corrective processing system is a beam processing system, and the corrective process includes generating a processing particle beam, wherein applying the corrective process includes irradiating the processing particle beam along a beam scan pattern onto the target region of a workpiece. The corrective process further includes scanning the workpiece through the particle beam, controllably adjusting at least one scan property of the scanner in response to a correction map for treating the workpiece, and when pre-specified scan property limits are achieved, controllably adjusting a duty cycle for toggling the beam flux of the particle beam between at least two different states. In doing so, processes can be performed when corrective conditions, e.g., scan speed, exceed equipment limitations, e.g., a maximum scan speed or maximum scan acceleration.

Embodiments described herein can be applied to any size or shape for the workpiece. As an example, the workpiece can include a disc-like object (or wafer), or rectangular object (or panel). A lateral dimension of the workpiece (e.g., width, diameter, etc.) can be approximately 100 mm, 200 mm, 300 mm, 450 mm, or greater, for example. The apparatus for generating the particle beam can include equipment for generating a neutral beam, an accelerated neutral beam, a charged particle beam, an uncharged particle beam, an ion beam, a gas cluster beam (GCB), or a gas cluster ion beam (GCIB), or any portion thereof, or any combination thereof.

Figure 1:
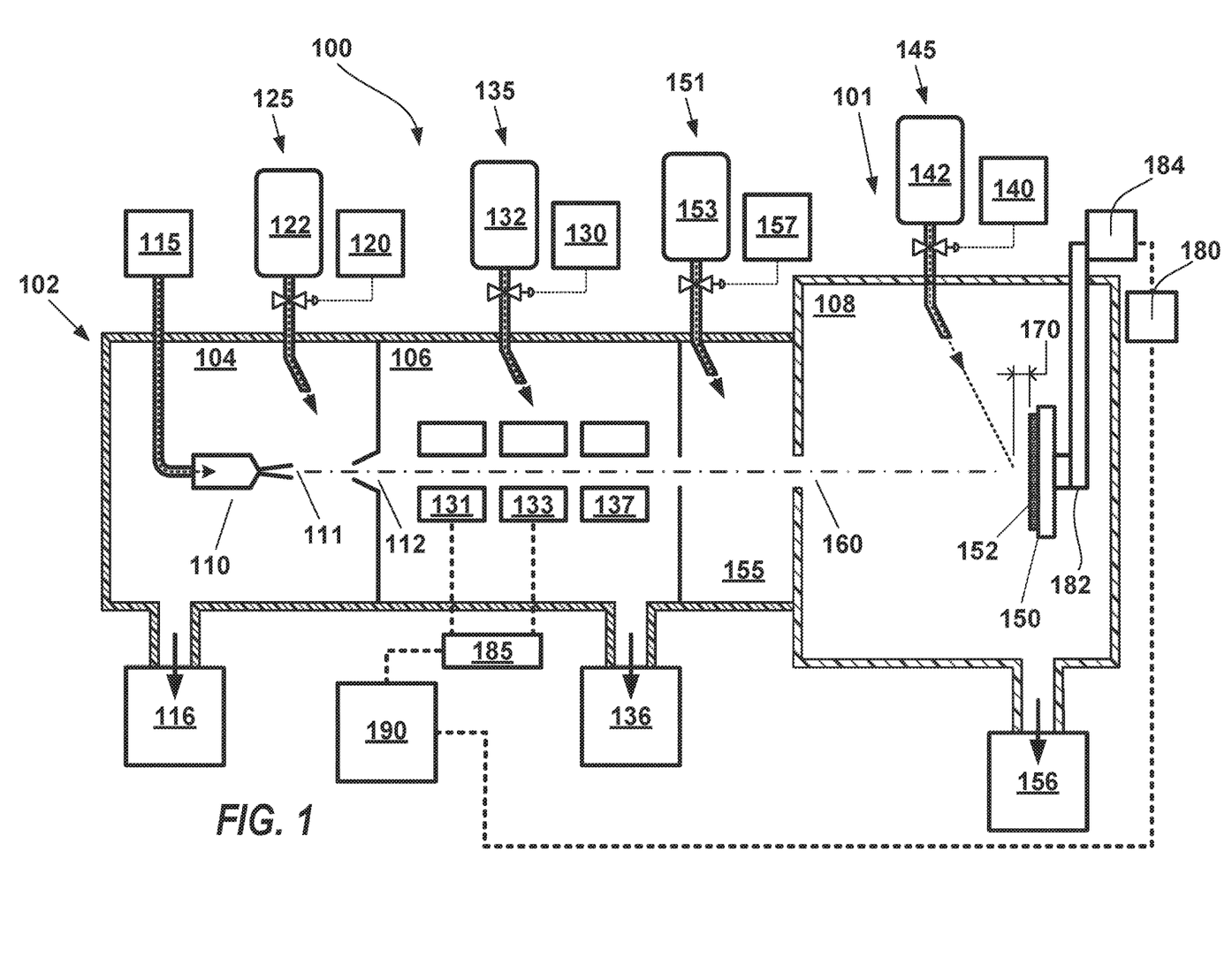
FIG. 1 provides an illustration of a beam processing system according to an embodiment.

Referring now to the drawings wherein like reference numerals designate corresponding parts throughout the several views. As shown in FIG. 1, a gas cluster ion beam (GCIB) processing system 100 is described according to an embodiment. As noted above, the processing system can include systems for generating particle beams of alternate composition, e.g., neutral beam, ion beam, charged particle beam, gas cluster beam, etc. While a single beam system will be described, the processing system can include plural beam-lines for forming multiple particle beams. In particular, GCIB processing system 100 includes a GCIB source 101 having a nozzle assembly 110 that is configured to introduce a primary gas through the nozzle assembly 110 to a vacuum vessel 102 in order to produce a gas cluster beam. A skimmer 112 is positioned downstream from the nozzle assembly 110, and configured to deflect or 'skim' a peripheral portion of the gas cluster beam.

The GCIB processing system 100 includes an ionizer 131 to ionize a portion of the gas cluster beam and form a gas cluster ion beam, an acceleration electrode assembly 133 to accelerate the gas cluster ion beam, and a beam filter 137 to filter or remove a portion of the gas cluster ion beam. The GCIB processing system 100 can also include a neutralizer (not shown) to neutralize the charge in the beam.

The GCIB processing system 100 further includes a workpiece holder 150, upon which a workpiece 152 to be processed is affixed and scanned within vacuum vessel 102 using scanner 184 and scan arm 182. A scanner control circuit 180 is coupled to the scanner 184, and configured to control a scan property of the scanner 184. The scan property can include a scan velocity, a scan path, a scan acceleration, a scan location, or any combination of two or more thereof.

Vacuum vessel 102 comprises three communicating chambers, namely, a source chamber 104, an ionization/ acceleration chamber 106, and a processing chamber 108 to provide a reduced-pressure enclosure. The three chambers are evacuated to suitable operating pressures by one or more vacuum pumping systems. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat workpiece 152. The vacuum vessel 102 may also include a pressure cell chamber 155. The pressure cell chamber 155 is coupled to a cell gas source 151 including cell gas supply system 153 and cell gas controller 157 that supplies a background gas, such as an inert gas, to the pressure cell chamber 155 for elevating the pressure in the pressure cell chamber 155.

The GCIB processing system 100 can optionally include a secondary gas source (125, 135, 145), wherein the secondary gas source (125, 135, 145) includes a secondary gas supply system (122, 132, 142) that delivers a secondary gas, and a secondary gas controller (120, 130, 140) that operatively controls the flow of the secondary gas injected into the GCIB processing system 100 downstream of the nozzle assembly 110. In one embodiment, the secondary gas source 125 is arranged to deliver the secondary gas into the source chamber 104 downstream of the exit 111 of the nozzle assembly 110. In another embodiment, the secondary gas source 135 is arranged to deliver the secondary gas into the ionization/acceleration chamber 106 downstream of a skimmer 112. In another embodiment, the secondary gas source 145 is arranged to deliver the secondary gas into the processing chamber 108 downstream of a final aperture 160. In another embodiment, any combination of the secondary gas source (125, 135, 145) may be used.

In another embodiment, the secondary gas source 145 is arranged to deliver the secondary gas into the processing chamber 108 downstream of the final aperture 160 and along a path that intersects the GCIB at a location spaced away from the exposed surface of workpiece 152 by a separation distance 170 (for example, the secondary gas is directed to the processing chamber 108 at or near an impact region of the GCIB with the substrate). Separation distance 170 may be a distance less than 10 mm, less than 5 mm, less than 2 mm, or substantially nil (the secondary gas may be a jet or beam that intersects the GCIB at the exposed surface of the substrate).

The secondary gas controller (120, 130, 140) may be coupled to one or more flow control valves, flow sensors, or pressure sensors. And, the secondary gas controller (120, 130, 140) can control a pressure (e.g., total/stagnation pressure) at which the secondary gas is injected, or a flow rate of the secondary gas, or combination thereof.

Additional details concerning the design of a gas cluster ion beam system are provided in U.S. Patent Application Publication No. 2010/0193701A1, entitled "Multiple Nozzle Gas Cluster Ion Beam System" and filed on Apr. 23, 2009; and U.S. Patent Application Publication No. 2010/ 0193472A1, entitled "Multiple Nozzle Gas Cluster Ion Beam Processing System and Method of Operating" and filed on Mar. 26, 2010; the contents of which are herein incorporated by reference in their entirety.

GCIB processing system 100 further includes a beam control circuit 185 coupled to at least one beam-line component, such as the ionizer 131 and/or the acceleration electrode assembly 133, and configured to control the beam flux of the particle beam according to a duty cycle for switching between at least two different states during processing. The beam control circuit 185 can toggle the particle beam between a substantially on-state and a substantially off-state, wherein the beam flux for the on-state can be appreciably greater than the off-state.

As noted above, the beam control circuit 185 can be coupled to the ionizer 131, wherein the ionizer 131 can be controlled to toggle the particle beam between a charged state and an uncharged state. In one embodiment, the beam control circuit 185 can control the electron flux emanating from the ionizer 131 and intersecting with the particle beam. As an example, controlling the voltage on an exit electrode of the ionizer 131 can achieve this end. The voltage signal applied to the exit electrode can include a voltage dither signal. The voltage dither signal can be any waveform, including a square wave.

Alternatively, according to another embodiment, the beam control circuit 185 can be coupled to the acceleration electrode assembly 133, wherein the accelerator electrode assembly 133 is controlled to toggle the particle beam between at least two different accelerated states. Alternatively, according to another embodiment, the beam control circuit 185 can be coupled to a particle beam deflection electrode (not shown), wherein the beam deflection electrode is controlled to toggle the particle beam between at least two deflection states including an intersecting state and a non-intersecting state with the workpiece. Alternatively, according to yet another embodiment, the beam control circuit 185 can be coupled to a beam gate (not shown), wherein the beam gate is controlled to toggle the particle beam between a beam gate obstructed state and a beam gate unobstructed state.

The beam control circuit 185 can control the beam between at least two different states, wherein the at least two different states include an on-state and an off-state. The at least two different states can be two different beam fluxes, including a non-zero beam flux, and a zero or near-zero beam flux.

Figure 2A:
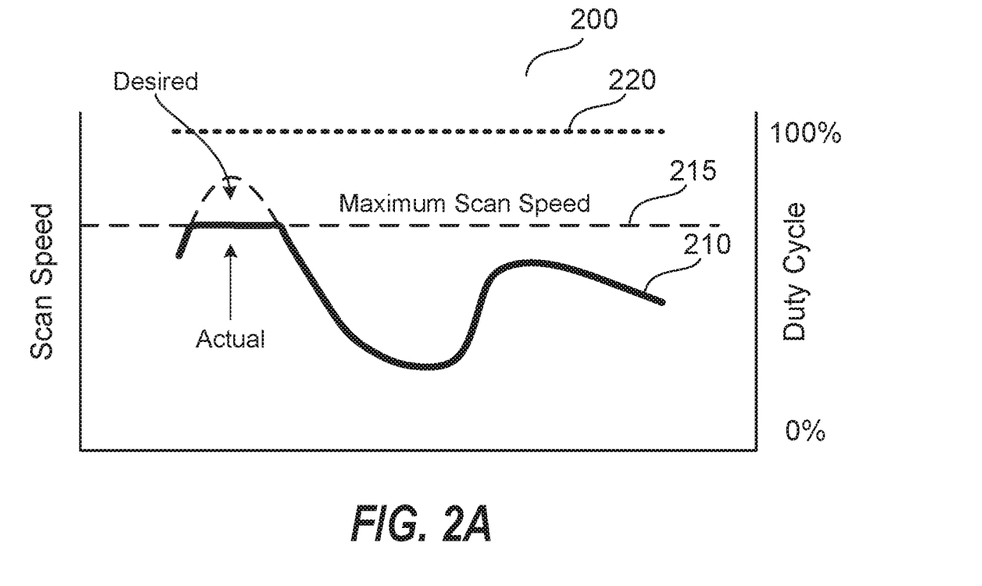
FIGS. 2A and 2B illustrate methods of processing a workpiece according to an embodiment.
Figure 2B:
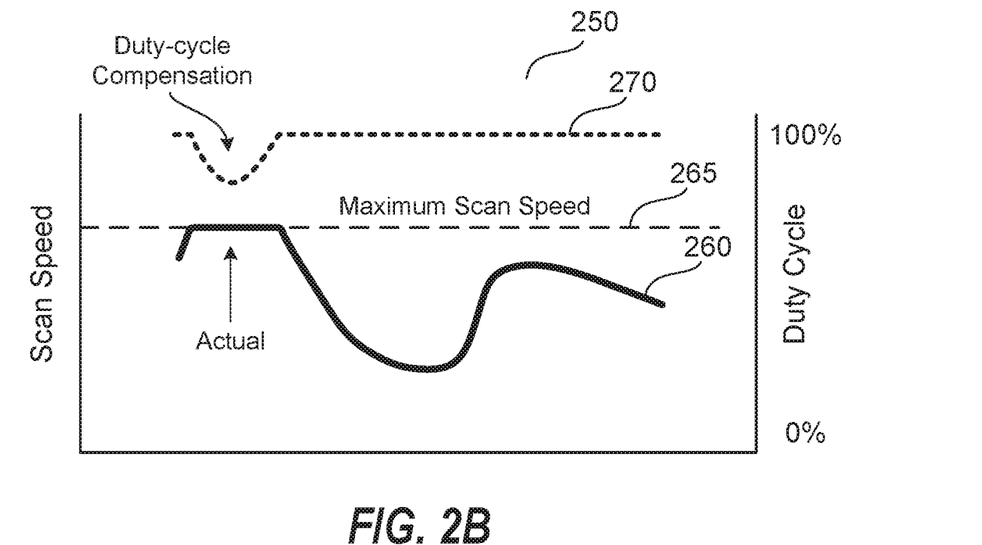

Referring now to FIGS. 2A and 2B, a first example for expanding the dynamic range of the processing system is described. FIG. 2A provides a plot 200 of scan speed 210 (y-axis on right) and duty cycle 220 (y-axis on left) versus time. As shown in FIG. 2A, the scanner control circuit can reach a maximum scan velocity 215 when applying a correction map to a workpiece. Some regions of the workpiece may require more processing, whereas other regions of the workpiece require less processing. To achieve less processing of a region on the workpiece, the workpiece is scanned at a higher scan speed so that the region requiring less processing is exposed to the beam a lesser amount of time. FIG. 2A illustrates a workpiece scan that encounters a maximum scan speed condition (e.g., desired condition exceeds maximum scan speed, and results in capped actual condition).

To compensate for reaching the maximum scan speed, the beam control circuit 185 decreases the duty cycle for switching the beam flux between at least two different states in response to reaching the maximum scan velocity. FIG. 2B provides a plot 250 of scan speed 260 (y-axis on right) and duty cycle 270 (y-axis on left) versus time. As shown in FIG. 2B, the scanner control circuit can reach a maximum scan velocity 265 when applying a correction map to a workpiece. As a result, the duty cycle is reduced from 100% (beam flux at constant on-state) to less than 100% (beam flux switched between on-state and off-state at net less than 100% on-state). For example, the duty cycle can be reduced to 80%, wherein the beam flux is non-zero for 80% of a processing time duration, and substantially zero for 20% of the processing time duration.

Figure 3A:
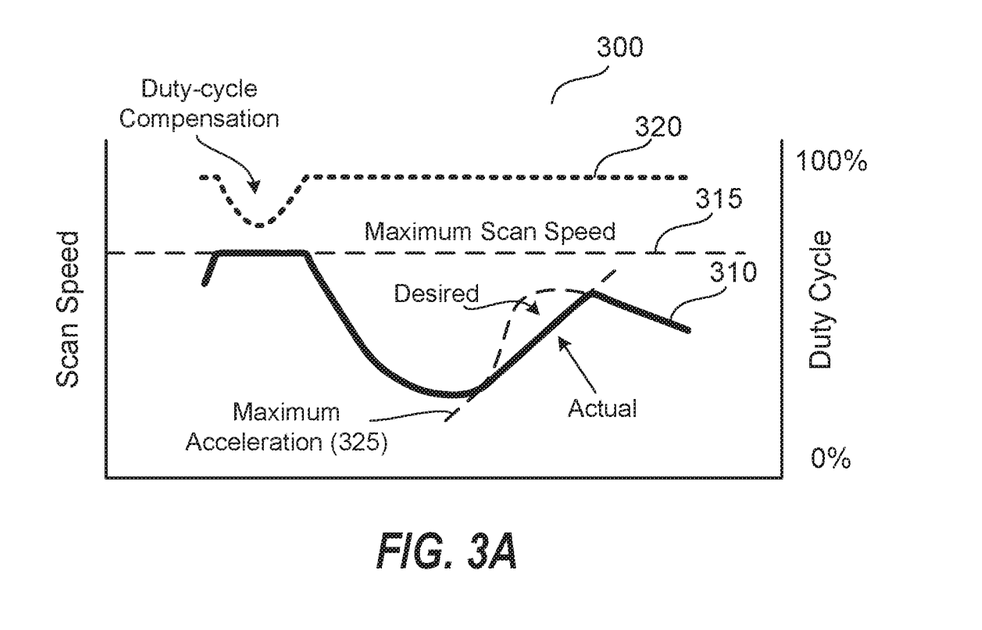
FIGS. 3A and 3B illustrate methods of processing a workpiece according to another embodiment.
Figure 3B:
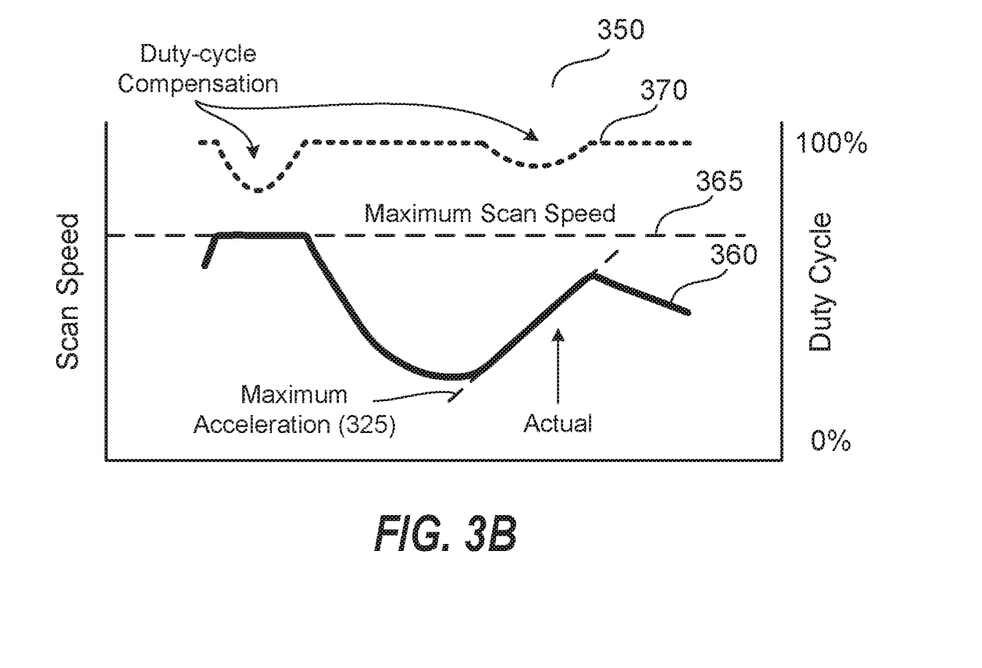

Referring now to FIGS. 3A and 3B, a second example for expanding the dynamic range of the processing system is described. FIG. 3A provides a plot 300 of scan speed 310 (y-axis on right) and duty cycle 320 (y-axis on left) versus time. As shown in FIG. 3A, the scanner control circuit can reach a maximum scan acceleration 325 when applying a correction map to a workpiece. Some regions of the workpiece may require more processing, whereas other regions of the workpiece require less processing, and the correction gradients (rate of change of scan speed in time, which correlates with spatial rate of change of feature attribute on workpiece) may require high rates of acceleration and deceleration. To achieve less processing of a region on the workpiece where large correction gradients exist, the workpiece is scanned at a higher scan acceleration and scan speed so that the region requiring less processing is exposed to the beam a lesser amount of time. FIG. 3A illustrates a workpiece scan that encounters a maximum scan acceleration condition (e.g., desired condition exceeds maximum scan acceleration, and results in capped actual condition).

To compensate for reaching the maximum scan acceleration speed, the beam control circuit 185 decreases the duty cycle for switching the beam flux between at least two different states in response to reaching the maximum scan acceleration. FIG. 3B provides a plot 350 of scan speed 360 (y-axis on right) and duty cycle 370 (y-axis on left) versus time. As shown in FIG. 3B, the scanner control circuit can reach a maximum scan velocity 365 or maximum scan acceleration 325 when applying a correction map to a workpiece. As a result, the duty cycle is reduced from 100% (beam flux at constant on-state) to less than 100% (beam flux switched between on-state and off-state at net less than 100% on-state). For example, the duty cycle can be reduced to 80%, wherein the beam flux is non-zero for 80% of a processing time duration, and substantially zero for 20% of the processing time duration.

Further yet, the GCIB processing system 100 includes a controller 190 programmably configured to instruct the scanner control circuit 180 and the beam control circuit 185, and expand the dynamic range of the beam processing in response to a correction map defining control data for changing spatially distinct surface properties of the workpiece (i.e., workpiece attributes).

Figure 4:
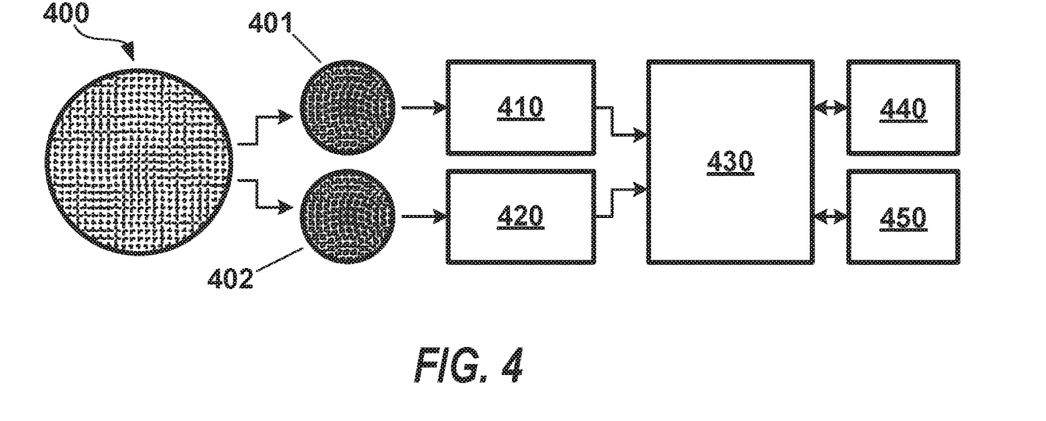
FIG. 4 provides an illustration of a corrective processing system according to an embodiment.
Figure 5:
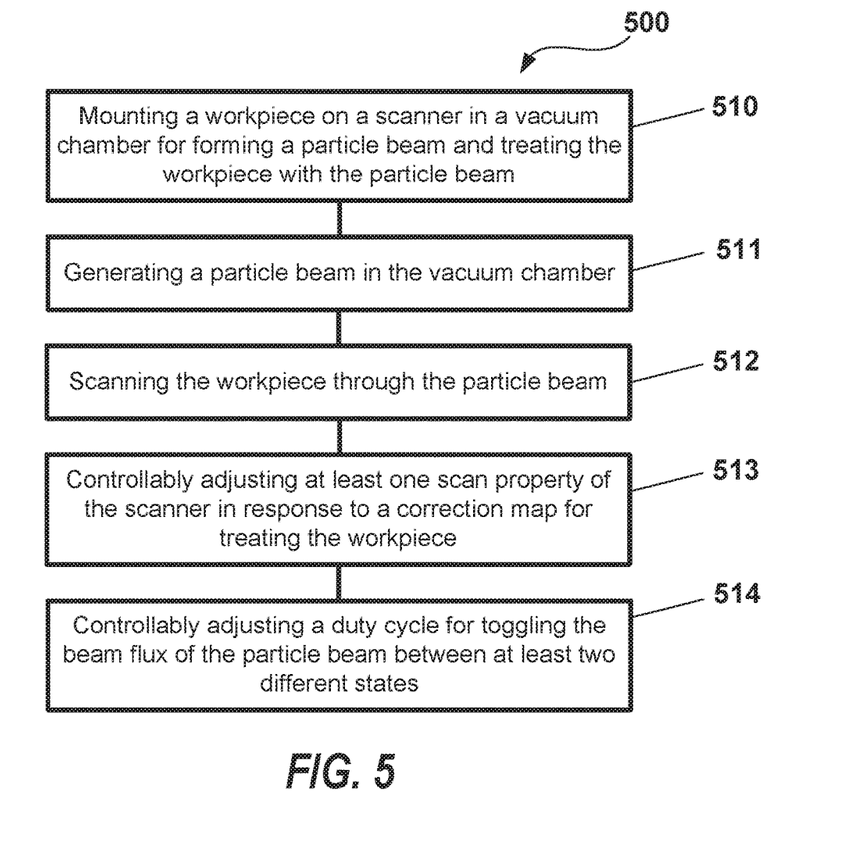
FIG. 5 is a flow chart illustrating a method for processing a workpiece according to another embodiment.

FIG. 5 provides a flow chart 500 illustrating a method for processing a workpiece with a particle beam according to an embodiment, and FIG. 4 provides an illustration of a corrective processing system according to an embodiment.

The method illustrated in flow chart 500 begins in 510 with mounting a workpiece on a scanner in a vacuum chamber for forming a particle beam and treating the workpiece with the particle beam. In 520, a particle beam is generated in the vacuum chamber, and in 530, the workpiece is scanned through the particle beam. In 540, at least one scan property of the scanner is controllably adjusted in response to a correction map for treating the workpiece. And, in 550, when pre-specified scan property limits are achieved, a duty cycle is controllably adjusted for toggling the beam flux of the particle beam between at least two different states.

To controllably adjust at least one scan property of the scanner and the duty cycle for the particle beam, a correction map for spatially altering a measured attribute of the workpiece is computed. It begins with receiving a set of parametric data from a data source that diagnostically relates to at least a portion of the workpiece. The workpiece can, for example, include an electronic device substrate, an RF filter substrate, a semiconductor substrate, or a flat panel display or device.

The data source, which includes the set of parametric data, can provide data measured on the workpiece or another production workpiece. For example, the set of parametric data includes data from an RF filter measurement set. The set of parametric data, including the measured attribute, may be acquired using a metrology system coupled to a corrective processing system, either in-situ or ex-situ. The metrology system may comprise any variety of workpiece diagnostic system including, but not limited to, geometrical, mechanical, optical, and/or electrical test/metrology systems. For example, the metrology system may include optical digital profilometry (ODP), scatterometry, ellipsometry, reflectometry, interferometry, X-ray fluorescence spectroscopy, scanning electron microscopy (SEM), tunneling electron microscopy (TEM), atomic force microscopy (AFM), or four-point probe sensing, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a workpiece.

The set of parametric data may be measured at two or more locations on the workpiece. Moreover, this data may be acquired and collected for one or more workpieces. The one or more workpieces may, for instance, include a cassette of workpieces. The set of parametric data is measured at two or more locations on at least one of the one or more workpieces and may, for example, be acquired at a plurality of locations on each of the one or more workpieces. Thereafter, the plurality of locations on each of the plurality of workpieces can be expanded from measured sites to unmeasured sites using a data fitting algorithm. For example, the data fitting algorithm can include interpolation (linear or nonlinear) or extrapolation (linear or nonlinear) or a combination thereof.

Furthermore, the data source, which includes the set of parametric data, can also include simulated data, or empirically determined data. For example, the simulated data can include computer model generated data. Additionally, for example, the empirically determined data can include data generated or assembled from past experience, experiments, observations, measurements, or simulations.

The set of parametric data can include geometrical, mechanical, electrical, and/or optical parameters associated with the workpiece, any layer or sub-layer formed on the workpiece, and/or any portion of a device on the workpiece. For example, the measured attribute can include a film thickness, a surface and/or interfacial roughness, a surface contamination, a feature depth, a trench depth, a via depth, a feature width, a trench width, a via width, a critical dimension (CD), a surface roughness, or an electrical resistance, or any combination of two or more thereof.

Using the processing system for treating the workpiece with the particle beam, an applied property of the corrective process, i.e., at least one scan property of the scanner and a duty cycle of the particle beam, can be spatially modulated, based at least in part on the parametric data, as a function of position on the workpiece to achieve a target profile of a workpiece attribute. The corrective process can include an etch process, a deposition process, a growth process, a smoothing process, a doping process, a modification process, or any combination of two or more thereof to achieve a target profile of a workpiece attribute of the workpiece.

As illustrated in FIG. 4, once a set of parametric data 400 is retrieved, the set of parametric data is provided to computing elements 410, 420 for computing correction data and generating the corrective process, including first control data 401 for the at least one scan property of the scanner and second control data 402 for the duty cycle for the particle beam. Controller 430 communicates and instructs the scanner control circuit 440 and the beam control circuit 450 via data and control signals to execute the control data 401, 402. Data and control signals may be communicated between the metrology system and the computing elements 410, 420 via a physical connection (e.g., a cable), or a wireless connection, or a combination thereof. Additionally, the parametric data may be communicated via an intranet or Internet connection. Alternatively, the superset of parametric data may be communicated between the metrology system and the controller via a computer readable medium.

Correction data is computed for corrective processing of the workpiece. More specifically, the correction data may be computed using the initial profile and the target profile for the measured attribute. The correction data for a given workpiece can comprise a process condition for modulation of a processing system property, such as the scan speed, the duty cycle of the particle beam, the beam dose, or other/additional process parameter (e.g., temperature), as a function of position on the workpiece in order to achieve a change between the parametric data associated with the incoming initial profile and the target profile for the given workpiece. For example, the correction data for a given workpiece can comprise determining a process condition for using the corrective processing system to correct a non-uniformity of the parametric data for the given workpiece. Alternatively, for example, the correction data for a given workpiece can comprise determining a process condition for using the corrective processing system to create a specifically intended non-uniformity of the parametric data for the given workpiece.

Figure 6:
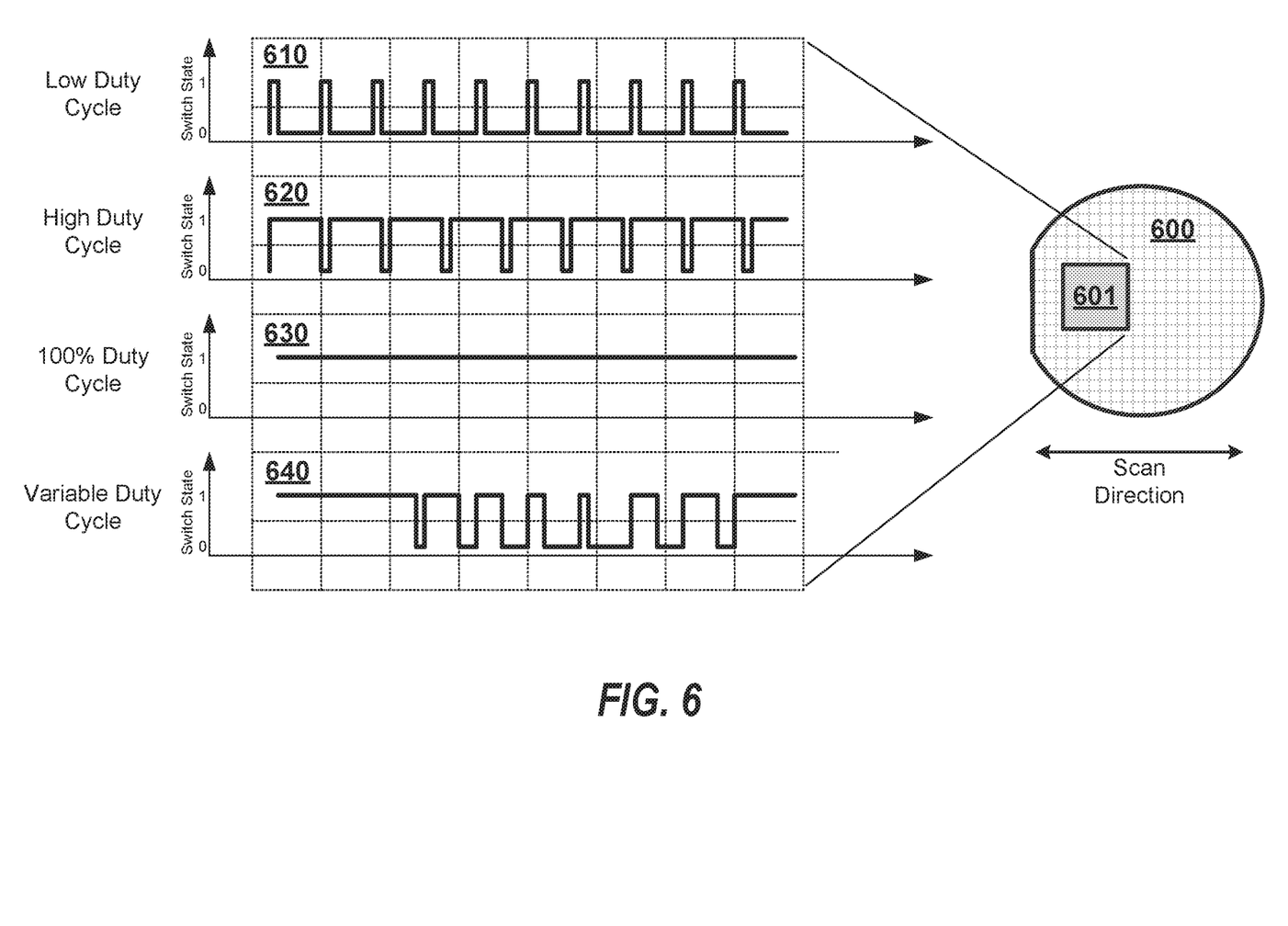
FIG. 6 illustrates an application of duty cycle compensated processing according yet another embodiment.

FIG. 6 illustrates an application of duty cycle compensated processing according yet another embodiment. A workpiece 600 is scanned through a particle beam, and through at least a portion 601 of the workpiece 600, the particle beam is toggled or pulsed between at least two different beam switch states, such as an on-state (e.g., '1') and an off-state (e.g., '0'), as shown. The beam switch state is illustrated for four (4) different duty cycles, i.e., a relatively low duty cycle 610, a relatively high duty cycle 620, a 100% duty cycle 630, and a variable duty cycle 640. The beam switch frequency (or pulse frequency) can exceed 100 Hz, and can range from 100 Hz to 10 kHz, or preferably range from 500 Hz to 5 kHz.

In FIGS. 2B and 3B, as well as part of FIG. 6, the beam duty cycle is shown to be set at 100%. However, it is not necessary to set the beam duty cycle at 100%, and then adjust accordingly, typically by reducing the duty cycle (FIGS. 2B and 3B). The beam duty cycle can be set at a value less than 100%, thus permitting either an increase or decrease in the duty cycle to accommodate changing process conditions across a workpiece. Variations to the beam duty cycle may be cyclical, acyclical, periodic, aperiodic, continuous, or discontinuous. The beam duty cycle may vary across the workpiece discontinuously. For example, portions of the workpiece can be treated with a beam nominally set at 100% beam duty cycle, and other portions of the workpiece can be treated with a beam nominally set at a beam duty cycle set at 0%.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. An apparatus for processing a workpiece with a beam, comprising:
    a vacuum chamber having a beam-line for forming a particle beam and treating a workpiece with the particle beam;
    a scanner for translating the workpiece through the particle beam;
    a scanner control circuit configured to control at least one operational scan property of the scanner that is related to movement of the scanner for translating the workpiece; and
    a beam control circuit configured to control the beam flux of the particle beam according to a duty cycle for the particle beam;
    a control system including a controller coupled with the scanner control circuit and beam control circuit, the control system configured for processing parametric data associated with at least one attribute of at least a portion of the workpiece for use in corrective processing of the workpiece;
    the controller configured to instruct the scanner control circuit and instruct the beam control circuit in corrective processing of the workpiece to alter at least one workpiece attribute including instructing the scanner control circuit to achieve a desired operational scan property for movement of the scanner for the corrective processing;
    the controller further configured to determine a limitation condition of when the desired operational scan property reaches a maximum operational scan property for movement of the scanner and to controllably vary the duty cycle through the beam control circuit to compensate for that limitation in the movement of the scanner and thereby expand the dynamic range of the beam processing.

2. The apparatus of claim 1, wherein the particle beam includes a charged particle beam or an un-charged particle beam.

3. The apparatus of claim 2, where the particle beam includes a neutral beam, a gas cluster beam, a gas cluster ion beam, an ion beam, an electron beam, or combinations thereof.

4. The apparatus of claim 1, wherein the vacuum chamber includes plural beam-lines for forming multiple particle beams.

5. The apparatus of claim 1, wherein the operational scan property related to movement of the scanner includes a scan velocity, a scan path, a scan acceleration, a scan location, or any combination of two or more thereof.

6. The apparatus of claim 1, wherein the beam control circuit toggles the particle beam between a substantially on-state and a substantially off-state, the beam flux for the on-state being appreciably greater than beam flux for the off-state.

7. The apparatus of claim 1, wherein the beam control circuit is coupled to an ionizer, and wherein the ionizer is controlled to toggle the particle beam between a charged state and an uncharged state.

8. The apparatus of claim 7, wherein the beam control circuit controls the electron flux emanating from the ionizer and intersecting with the particle beam.

9. The apparatus of claim 1, wherein the beam control circuit is coupled to an acceleration electrode, and wherein the acceleration electrode is controlled to toggle the particle beam between at least two different accelerated states.

10. The apparatus of claim 1, wherein the beam control circuit is coupled to a particle beam deflection electrode, and wherein the beam deflection electrode is controlled to toggle the particle beam between at least two deflection states including an intersecting state and a non-intersecting state with the workpiece.

11. The apparatus of claim 1, wherein the beam control circuit is coupled to a beam gate, and wherein the beam gate is controlled to toggle the particle beam between a beam gate obstructed state and a beam gate unobstructed state.

12. The apparatus of claim 1, wherein the beam control circuit is configured to control the beam flux of the particle beam according to a duty cycle for switching between at least two different states during processing;
    the at least two different states include an on-state and an off-state.

13. The apparatus of claim 1, wherein the controller is configured to determine that the scanner control circuit reaches a maximum operational scan property including a maximum scan velocity, and wherein the beam control circuit varies the duty cycle by decreasing the duty cycle in response to reaching the maximum scan velocity.

14. The apparatus of claim 1, wherein the controller is configured to determine that the scanner control circuit reaches a maximum a maximum operational scan property including a scan acceleration, and wherein the beam control circuit varies the duty cycle by decreasing the duty cycle in response to reaching the maximum scan acceleration.

15. A method for processing a workpiece with a particle beam, comprising:
    mounting a workpiece on a scanner in a vacuum chamber for treating the workpiece;
    generating a particle beam in the vacuum chamber;
    translating the workpiece through the particle beam with the scanner and controlling at least one operational scan property of the scanner that is related to movement of the scanner for translating the workpiece;
    controlling the beam flux of the particle beam according to a duty cycle for the particle beam;
    processing parametric data associated with an attribute of at least a portion of the workpiece for use in corrective processing of the workpiece;
    controllably adjusting the at least one operational scan property of the scanner and controllably adjusting the particle beam in applying the corrective processing for the workpiece including controlling the scanner to achieve a desired operational scan property for the corrective processing;
    determining a limitation condition of when the desired operational scan property reaches a maximum operational scan property for movement of the scanner;

controlling the particle beam for controllably varying the duty cycle through the beam control circuit to compensate for that limitation in the movement of the scanner and thereby expand the dynamic range of the beam processing.

16. The method of claim 15, where the particle beam includes a charged particle beam or an uncharged particle beam.

17. The method of claim 16, where the particle beam includes a neutral beam, a gas cluster beam, a gas cluster ion beam, an ion beam, an electron beam, or combinations thereof.

18. The method of claim 16, further comprising determining the limitation condition in controlling a scan property of the scanner including determining when a maximum scan velocity is reached.

19. The method of claim 17, further comprising determining the limitation condition in controlling a scan property of the scanner including determining when a maximum scan acceleration is reached.

* * * * *

UNITED STATES PATENT AND TRADEMARK OFFICE
CERTIFICATE OF CORRECTION

PATENT NO. : 10,861,674 B2
APPLICATION NO. : 16/665357
DATED : December 8, 2020
INVENTOR(S) : Matthew C. Gwinn et al.

It is certified that error appears in the above-identified patent and that said Letters Patent is hereby corrected as shown below:

In the Claims

Column 10, Lines 39-42, Claim 14, "The apparatus of claim 1, wherein the controller is configured to determine that the scanner control circuit reaches a maximum a maximum operational scan property including a scan acceleration, and wherein the beam control" should be --The apparatus of claim 1, wherein the controller is configured to determine that the scanner control circuit reaches a maximum operational scan property including a scan acceleration, and wherein the beam control--.

Signed and Sealed this
Twenty-first Day of December, 2021

Drew Hirshfeld
*Performing the Functions and Duties of the
Under Secretary of Commerce for Intellectual Property and
Director of the United States Patent and Trademark Office*